United States Patent [19]

Shimbo

[11] Patent Number: 4,924,279

[45] Date of Patent: May 8, 1990

[54] THIN FILM TRANSISTOR

[75] Inventor: Masafumi Shimbo, Tokyo, Japan

[73] Assignee: Seiko Instruments Inc., Japan

[21] Appl. No.: 608,981

[22] Filed: May 10, 1984

[30] Foreign Application Priority Data

May 12, 1983 [JP] Japan .................. 58-83383

[51] Int. Cl.$^5$ ............................. H01L 29/78
[52] U.S. Cl. ....................... 357/23.7; 357/2; 357/4; 357/23.4
[58] Field of Search ............ 357/23.7, 4, 23.4, 2

[56] References Cited

U.S. PATENT DOCUMENTS

| 3,493,812 | 2/1970 | Weimer | 357/4 |
| 4,547,789 | 10/1985 | Cannella | 357/23.4 |

FOREIGN PATENT DOCUMENTS

| 0075877 | 7/1978 | Japan | 357/23.7 |
| 0005951 | 3/1979 | Japan | 357/23.4 |
| 0128060 | 8/1982 | Japan | 357/23.7 |
| 0063173 | 4/1983 | Japan | 357/23.7 |

OTHER PUBLICATIONS

IBM Technical Disclosure Bulletin, vol. 11 #3, Aug. 1968, by Drangeid, pp. 332, 333.

*Primary Examiner*—Andrew J. James
*Assistant Examiner*—Mark Prenty
*Attorney, Agent, or Firm*—Bruce L. Adams; Van C. Wilks

[57] ABSTRACT

According to the present invention, a thin film transistor of a vertical type in which an electric current flows in a vertical direction not parallel to a base plate surface. A high resistance semiconductor thin film, a gate insulated film and gate electrode are sequentially shaped on a side surface of drain and source main electrodes stacked as multi-layers via an insulated film, whereby a channel length L is determined by a thickness of said insulated film.

36 Claims, 5 Drawing Sheets

THIN FILM TRANSISTOR

BACKGROUND OF THE INVENTION

The present invention relates to a thin film transistor (TFT) which has a non-crystal (amorphous) or polycrystal semiconductor thin film.

A conventional thin film transistor (TFT) using an amorphous silicon (a-Si) thin film has a lateral structure, whose cross-sectional construction is as shown in FIG. 1a or FIG. 1b.

In FIG. 1a, a gate electrode 4 covered by a gate insulator film 6 is selectively formed on an insulating substrate 1 such as glass, quartz, ceramics, or $SiO_2$-coated Si or metal, and further a high resistivity a-Si film 5 is deposited as a channel region on the gate insulator film 6. The main electrodes comprising source electrode 3 and drain electrode 2 are formed on the surface of the a-Si film 5. Further, an insulator film 7 such as an oxide film is frequently used to cover the a-Si film 5 for surface passivation.

The drain and source main electrodes 2 and 3 are composed of a metal film such as Al, Mg, Pt and Mn or metal silicide and an impurity-doped a-Si film.

In FIG. 1b, a gate electrode 4 is formed on the gate insulator film 6 deposited over the high resistivity a-Si film 5. The drain and source wiring metals 12 and 13 are respectively connected to the drain and source electrodes 2 and 3 comprised of a metal or semiconductor thin film. The drain and source electrodes 2 and 3 are formed under the a-Si film 5 and on the insulating substrate 1.

The conventional TFT can be applied to a low price integrated circuit and a large area TFT array (for example a liquid crystal display panel) since a low price glass is used as the substrate 1.

However, the carrier mobility of a-Si is generally less than 1/100 that of single crystal Si, and the a-Si TFT cannot operate at high speed and is therefore used in limited application.

Furthermore, it is so difficult during the TFT manufacturing to introduce a self-alignment technique using ion-implanation (which is conventionally used in manufacturing a single crystal MOS-IC), that a short-length channel TFT is difficult to achieve and this technique cannot be used to improve operation speed.

Moreover, since the conductivity of the a-Si is generally changed by light irradiation, it is necessary for the TFT to have a light-shielding layer when employed in a liquid crystal display panel which results in an increase in production processing and cost.

SUMMARY OF THE INVENTION

It is an object of the present invention to provide a new structure of thin film transistor (TFT) having a short channel length.

Another object of the present invention is to provide a TFT structure in which a light-shielding layer is not necessary.

It is a further object of the present invention to provide a TFT having a simple structure and a high operation speed.

BRIEF DESCRIPTION OF THE DRAWINGS

FIG. 3a is a sectional view of FIG. 3b taken along line 3a—3a and FIG. 3b is a sectional view of FIG. 3a taken along line 3b—3b.

DETAILED DESCRIPTION OF PREFERRED EMBODIMENTS

The preferred embodiments of the present invention will be described in detail in conjunction with the drawings.

Figure 2:
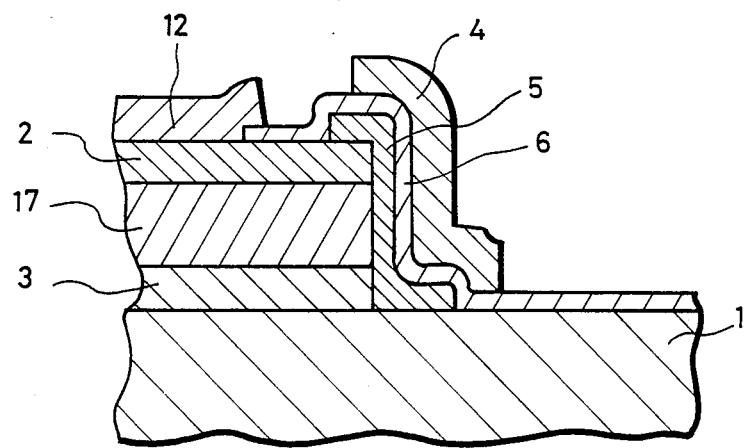
FIG. 2 shows a partially enlarged cross-sectional view of a TFT according to one embodiment of the present invention.

FIG. 2 shows a partially enlarged cross-sectional view of a thin film transistor of the present invention. A first main electrode thin film 3 (for example, the source), a spacer insulator film 17 and a second main electrode thin film 2 (for example, the drain) are sequentially stacked in a layered structure and formed as an island structure on an insulating substrate 1. For the substrate 1 can be used a glass or quartz substrate, ceramics substrate, plastics substrate, Si substrate coated with $SiO_2$ or nitride film or metal substrate of stainless steel coated with an insulator film. Further, a high resistivity semiconductor thin film 5 is deposited on the sidewall of the island of the stacked film structure and makes contact with the first and second electrodes 2 and 3.

A gate electrode 4 is formed on a surface of a gate insulator film 6 which covers the semiconductor thin film 5 on the sidewall of the island. In this structure, since the channel length L is determined by the thickness of the spacer insulator film 17, a TFT with a channel length less than 2 $\mu$m and more than 0.1 $\mu$m can be easily obtained.

Shortening the channel length improves the high frequency and high speed operation of the a-Si TFT even if the carrier mobility of the a-Si is low. Higher operation speed can be achieved when a polycrystal film or a recrystalized film (formed, for example, by beam-annealing) is used as the semiconductor thin film 5.

A metal film of Al, Mg, Pt, Cr, Mo, W or silicide metal, or an amorphous, polycrystalline or single crystalline semiconductor thin film can be used as the gate electrode 4, and the first and second main electrodes 3 and 2.

A polyimide resin oxide film, nitride film or aluminum oxide film can be used for the spacer insulator film 17 and the gate insulator film 6, these materials being preferred because they exhibit low conductivity and high breakdown voltage. In this structure, there is a merit in that no light-shielding film is necessary since any irradiated light is effectively blocked by the first and second main electrodes 3, 2 and the gate electrode 4 and the light is not directly illuminated on the semiconductor thin film 5.

Figure 3A:
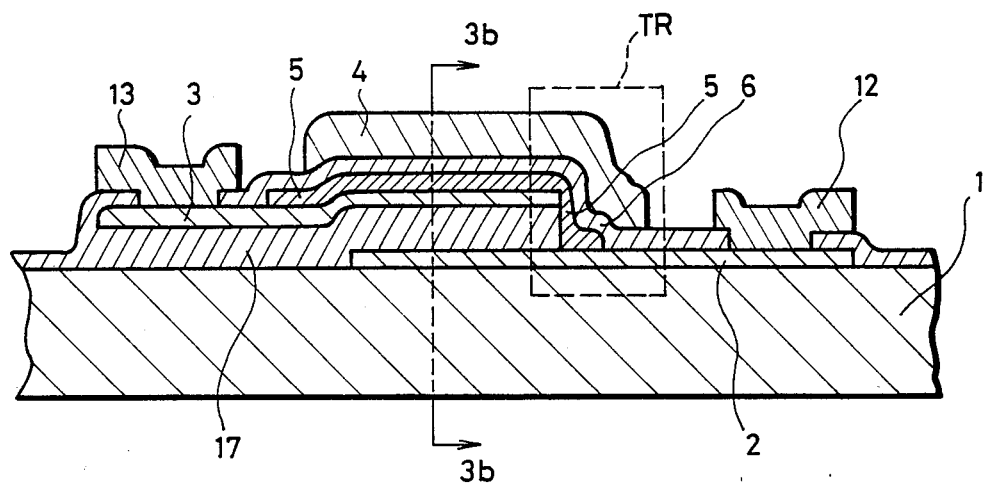
FIGS. 3a and 3b are cross-sectional views of a TFT according to another embodiment of the present invention, where
Figure 3B:
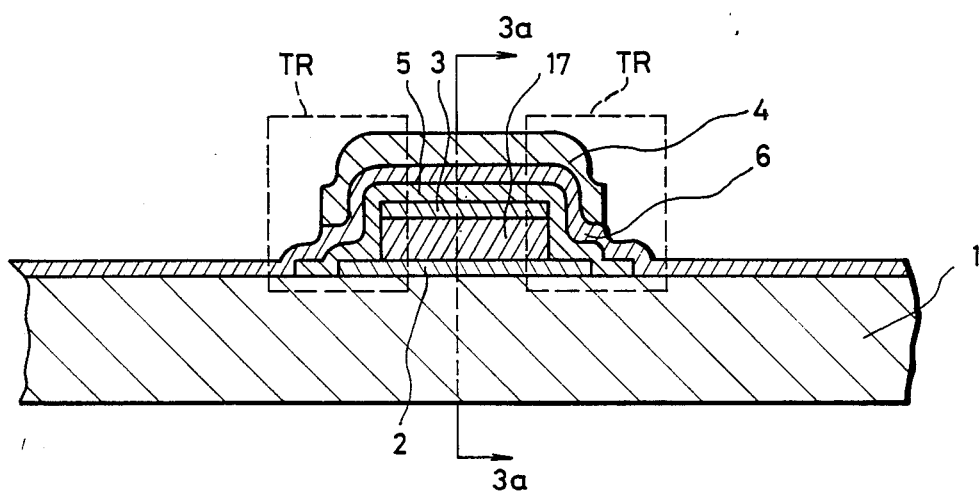

FIGS. 3a–3b show another embodiment of the present invention. In this embodiment, for example, a drain electrode thin film 2 as a first main electrode is formed on the glass substrate 1. A spacer insulator film 17 and source electrode thin film 3 (in this case, a second main electrode) are formed as a stacked-layered structure in the form of an island structure on the drain electrode 2. An a-Si film 5 is formed so as to cover the sidewall and surface of the island structure comprised of the spacer insulator film 17 and source electrode 3 and makes contact with the drain electrode 2, the a-Si film 5 defining field controlled current-conducting paths between the drain and source electrodes 2,3. A gate insulator film 6 and gate electrode 4 are formed on the a-Si film 5. The drain and source wiring metals 12 and 13 are connected to the drain and source electrodes 2 and 3 respectively. In this case, active portions (marked as TR in FIGS. 3a and 3b) of the TFT are formed along the edge of the island defined by the source electrode 3 and the spacer insulator film 17 so as to obtain a large channel width W for the TFT area.

Figure 4A:
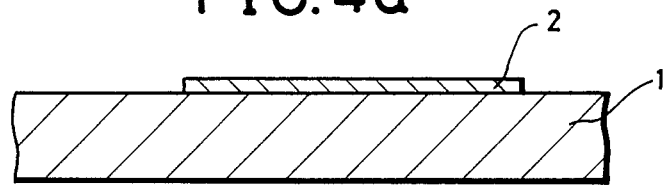
FIGS. 4a–4d and FIGS. 5a–5e show cross-sectional views of the TFT manufacturing process steps of the present invention.
Figure 4B:
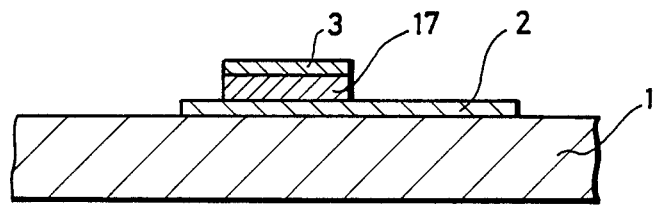

FIGS. 4a-4d show cross-sectional views for explaining one manufacturing process of a thin film transistor (TFT) according to the present invention. In FIG. 4a, a first main electrode thin film 2 is selectively formed on the glass substrate 1. The first main electrode 2 is made of metal film selected from Al, Mo, W, Mg or Cr or their silicide, or is preferably made of a two-layered film in which an a-Si film doped with n- or p-type impurity is deposited on the metal film described above to define means for injecting carriers into current-conducting paths defined by an a-Si film 5 which is described hereinafter. In FIG. 4b, a $SiO_2$ film 17 as a spacer insulator film and a second main electrode thin film 3 are deposited and selectively etched to form an island structure on the first main electrode thin film 2. The $SiO_2$ film 17 is deposited at a lower temperature by a plasma chemical vapor deposition (PCVD) method or photo-assisted CVD method, and the thickness thereof is about 1 $\mu$m.

The second main electrode thin film 3 is made of the same metal as the first main electrode thin film 2. An $n^+$ or $p^+$ a-Si film is preferably inserted under the second main electrode thin film 3 on the $SiO_2$ film 17.

Figure 4C:
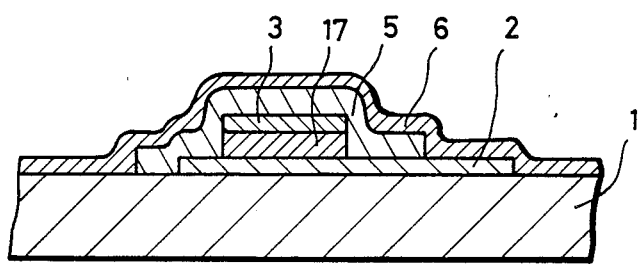

FIG. 4c shows a cross-sectional view in which a high resistivity a-Si film 5 is selectively formed over the island structure and a gate insulator film 6 is deposited over the film 5. The high resistivity a-Si film 5 is non-doped or slightly doped with impurity and defines field controlled current-conducting paths between the main electrode films 2,3. The a-Si film 5 is formed as an alloy with hydrogen or fluorine to reduce defects and is deposited by a deposition method such as PCVD, photo CVD, molecular beam evaporation (MBE) or ion beam deposition (IBD). A $SiO_2$ film or silicon nitride film, etc. is employed for the gate insulator film 6 and deposited by one of the above methods. The thicknesses of the a-Si film 5 and the gate insulator film 6 are determined from the necessary characteristics of the TFT and typical values are 0.2$\mu$ and 0.1$\mu$, respectively.

Figure 4D:
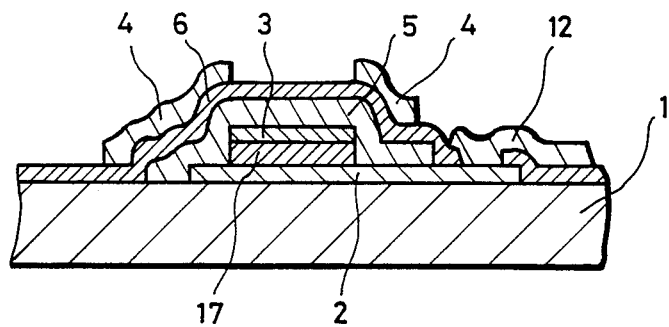

In FIG. 4d, after the formation of contact holes in the gate insulator film 6 by a selective etching method, a wiring metal film 12 of Al, etc. is connected with the first main electrode 2, and other wiring metal 13 (not shown) is connected with the second main electrode 3. A gate electrode 4 is formed on the gate insulator film 6 in the regions of the side surface of the island structure.

To fabricate the TFT of the present invention, the photo CVD, oblique MBE and IBD, etc. are particularly effective for depositing the a-Si film 5 and the gate insulator film 6 because these techniques effect good covering over the side surface of the island structure defined by the spacer insulator film 17 and the second electrode 3.

FIGS. 5a-5e show another manufacturing embodiment of the TFT of the present invention.

Figure 5A:
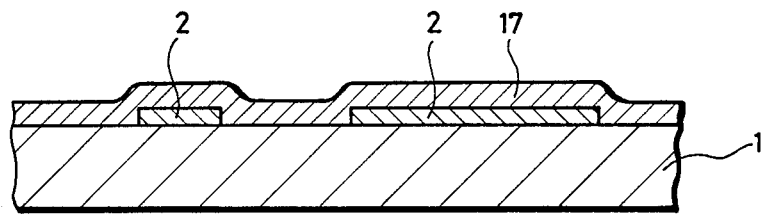

In FIG. 5a, after the main electrode 2 of $n^+$ a-Si is selectively formed on the glass substrate 1, the spacer insulator film 17 is deposited. In this embodiment, the first main electrode 2 has a particular ring shape so that only a part of the first main electrode 2 is overlapped by the second main electrode 3 (with the spacer insulator film 17 interposed therebetween) so as to reduce the capacitance between the first and the second electrodes 2 and 3.

Figure 5B:
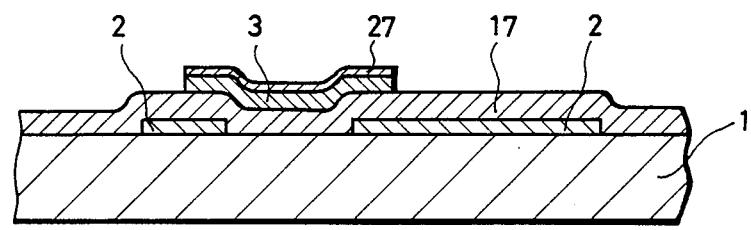

In FIG. 5b, the second main electrode 3 of $n^+$ a-Si and another insulator film 27 are deposited and selectively etched.

Figure 5C:
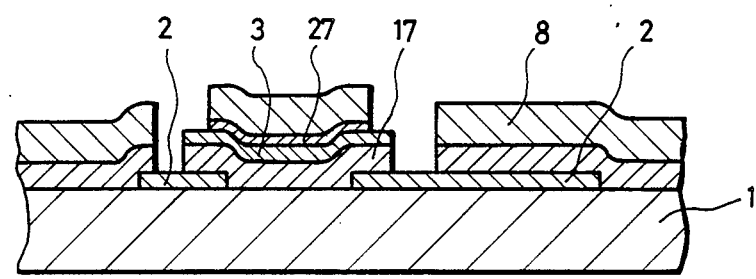

In FIG. 5c, a plurality of windows are formed in the spacer insulator film 17 by using the second main electrode 3 as part of a masking film and a resist 8 as a mask to expose the side surface of the island structure composed of the second main electrode 3 and the spacer insulator film 17.

Figure 5D:
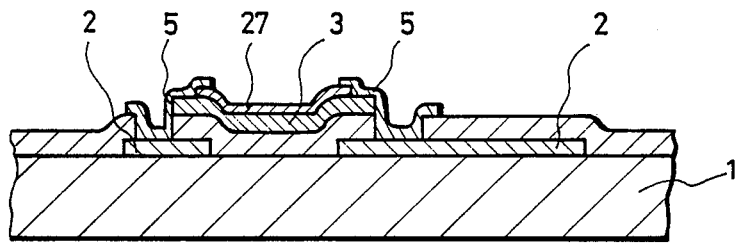
Figure 5E:
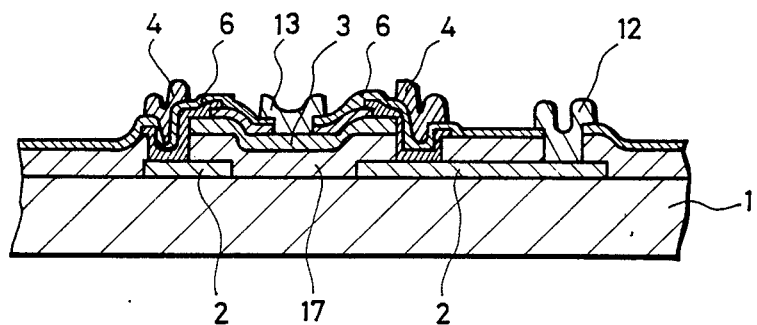

In FIG. 5d, after the resist 8 is eliminated, the high resistivity a-Si film 5 is formed in the windows and on side surface regions of the island structure. The second main electrode 3 of $n^+$ a-Si is suitably protected by the insulator film 27 when a selective etching process of tha a-Si film 5 is performed. Another method to selectively form the a-Si film 5 is a lift-off method in which the resist 8 is removed after depositing the a-Si film 5. After that, the formation of the TFT is finished by depositing the gate insulator film 6, opening contact holes in the spacer insulator film 17, and forming wiring metals 12 and 13 in the contact holes as shown in FIG. 5e.

Figure 1A:
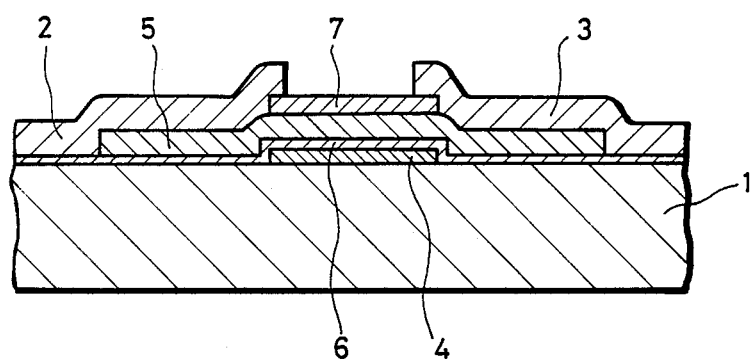
FIGS. 1a and 1b show cross-sectional views of conventional TFTs.
Figure 1B:
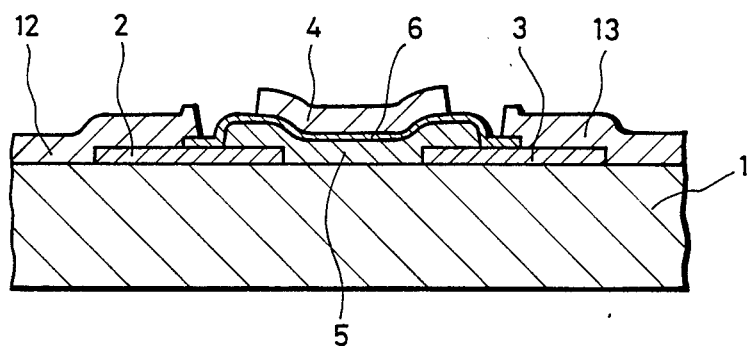

According to the TFT of the present invention, the channel length L can be shortened without need of using a fine patterning process and the light-shielding film utilized in prior art devices can be eliminated. Further, the TFT of the present invention can be constructed by processes having the same number of film depositions and masking steps used in conventional lateral TFT manufacturing, whereby the vertical TFT of the present invention and a conventional lateral TFT (as shown in FIG. 1b) can be formed on the same substrate.

While the invention has been described using amorphous Si as the material of the high resistivity semiconductor film 5, it is possible to use poly Si film or recrystalized Si film by the beam annealing (laser or lamp annealing) as the high resistivity semiconductor film, which enables higher operation speed of the TFT. Also, GaAs, etc. can be used for the material of the semiconductor thin film. Furthermore, according to the present invention, the TFT has a vertical construction so that it is very easy to make a multi-channel construction and to obtain high current drivability.

The TFT of the present invention is a vertical TFT having a small leakage current between the first and the second main electrodes as compared to the vertical TFT in the prior art described, for example, in Japanese Laid-Open Application No. 58-63173. This is because the first and the second electrodes sandwich a high resistivity semiconductor film of large area in the prior art, not a spacer insulator film of relatively small area as in the case of the present invention.

The TFT of the present invention has a high current drivability so that when such TFTs are used in liquid crystal display devices, the size of the switching transistors of the picture elements can be minimized and the transmission ratio enlarged, and it is possible to simultaneously form the a-Si TFT drive circuit on the same substrate.

I claim:

1. A thin film field effect transistor of the type formed on a substantially planar substrate, said transistor comprising:
   a plurality of layers, said plurality of layers being contiguous and formed over said substrate to form a drain region layer, a source region layer and an electrically insulating layer between said source and drain regions layers;
   said plurality of layers having edge portions forming a plurality of surfaces which are non-parallel to said substrate;
   a deposited semiconductor material layer overlying said non-parallel surfaces and electrically coupled to said drain region layer and said source region layer along said non-parallel surfaces for forming a plurality of current conduction channels therebetween;
   a gate insulator disposed over said deposited semiconductor material layer; and
   a gate electrode separated from said deposited semiconductor material layer by said gate insulator.

2. The thin film field effect transistor as defined in claim 1 wherein said deposited semiconductor material layer includes silicon.

3. The thin film field effect transistor as defined in claim 2 wherein said deposited semiconductor material layer is an amorphous silicon alloy.

4. The thin film field effect transistor as defined in claim 3 wherein said amorphous silicon alloy includes hydrogen.

5. The thin film field effect transistor as define in claim 3 wherein said amorphous silicon alloy includes fluorine.

6. The thin film field effect transistor as defined in claim 1 further including carrier injection means electrically coupled to said drain region, said source region, and said semiconductor material for injecting current conduction carriers into said current conduction channels between said source region layer and said drain region layer.

7. The thin film field effect transistor as defined in claim 6 wherein said carrier injection means comprises a first layer of semiconductor material adjacent said drain region layer and a second layer of semiconductor material adjacent said source region layer.

8. The thin film field effect transistor as defined in claim 7 wherein said first and second layers of semiconductor material are formed from a doped semiconductor material.

9. The thin film field effect transistor as defined in claim 8 wherein said doped semiconductor material is n-type.

10. The thin film field effect transistor as defined in claim 8 wherein said doped semiconductor is p-type.

11. The thin film field effect transistor as defined in claim 8 wherein said doped semiconductor material comprises a doped amorphous silicon alloy.

12. The thin film field effect transistor as defined in claim 11 wherein said doped amorphous silicon alloy is n-type.

13. The thin film field effect transistor as defined in claim 11 wherein said doped amorphous silicon alloy is p-type.

14. The thin film field effect transistor as defined in claim 7 wherein said first layer of semiconductor material is disposed between said drain region layer and said insulating layer.

15. The thin film field effect transistor as defined in claim 1 wherein said electrically insulating layer is silicon oxide ($SiO_x$).

16. The thin film field effect transistor as defined in claim 1 wherein said drain and source region layers are formed from metal.

17. The thin film field effect transistor as defined in claim 16 wherein said metal is molybdenum.

18. A thin film field effect transistor of the type including a substrate, said transistor comprising:
    a plurality of layers of deposited material, said layers being contiguous and forming a drain region layer, a source region layer and an electrically insulating layer between said drain and source region layers;
    said drain region layer, source region layer, and electrically insulating layer forming a plurality of adjacently extending surfaces which are non-parallel to said substrate;
    a plurality of regions of deposited semiconductor material extending over said adjacently extending non-parallel surfaces to form a plurality of field controlled current conducting paths between said source region layer and drain region layer;
    a gate insulator overlying said regions of deposited semiconductor material; and
    a gate electrode overlying said gate insulator.

19. The thin film field effect transistor as defined in claim 18 wherein said deposited semiconductor material includes silicon.

20. The thin film field effect transistor as defined in claim 19 wherein said deposited semiconductor material is an amorphous silicon alloy.

21. The thin film field effect transistor as defined in claim 20 wherein said amorphous silicon alloy includes hydrogen.

22. The thin film field effect transistor as defined in claim 20 wherein said amorphous silicon alloy includes fluorine.

23. The thin film field effect transistor as defined in claim 18 further including carrier injection means electrically coupled to said drain region layer, said source region layer, and said deposited semiconductor material for injecting current conduction carriers into said current conduction paths between said source region layer and said drain region layer.

24. The thin film field effect transistor as defined in claim 23 wherein said carrier injection means comprises a first layer of semiconductor material adjacent said drain region layer and a second layer of semiconductor material adjacent said source region layer.

25. The thin film field effect transistor as defined in claim 24 wherein said first and second layers of semiconductor material are formed from a doped semiconductor material.

26. The thin film field effect transistor as defined in claim 25 wherein said doped semiconductor material is n-type.

27. The thin film field effect transistor as defined in claim 25 wherein said doped semiconductor material is p-type.

28. The thin film field effect transistor as defined in claim 1, wherein the drain region layer is composed of a metal film on the substrate and a first impurity-doped semiconductor film of one conductivity type on the metal film, and the source region layer is composed of a second impurity-doped semiconductor film of the one conductivity type on the electrically insulating layer and a metal film on the second impurity-doped semiconductor film.

29. The thin film field effect transistor as defined in claim 28, wherein the deposited semiconductor material comprises an amorphous silicon film.

30. A thin film transistor comprising: an insulating substrate; a first main electrode formed on the insulating substrate and having a ring shape with an opening in the center portion thereof; a spacer insulator film formed on a portion of the first main electrode; a second main electrode formed on the spacer insulator film such that the second main electrode and spacer insulator film jointly define a stacked-layered structure overlying the ring-shaped first main electrode in the region adjacent the opening thereof; a high resistivity semiconductor film covering at least the side surface of the stacked-layered structure and being in contact with both said first and second main electrodes; a gate insulator film formed on the semiconductor film at least in the region where the semiconductor film covers the side surface of the stacked-layered structure; and a gate electrode formed on the gate insulator film at least in the region where the gate insulator film covers the semiconductor film on the side surface of the stacked-layered structure.

31. A thin film transistor according to claim 30; wherein the first main electrode, spacer insulator film and second main electrode have mutually superposed portions which jointly define the stacked-layered structure.

32. A thin film transistor according to claim 31; wherein the semiconductor film is effectively surrounded by the gate insulator film and the stacked-layered structure so as to shield the semiconductor film from externally irradiated light thereby eliminating the need for a separate light-shielding film to protect the semiconductor film.

33. A thin film transistor according to claim 32; wherein said high resistivity semiconductor film comprises an amorphous silicon film.

34. A thin film transistor according to claim 30; wherein the first main electrode is composed of a metal film on the insulating substrate and a first impurity-doped semiconductor film of one conductivity type of the metal film, and the second main electrode is composed of a second impurity-doped semiconductor film of one conductivity type on the spacer insulator film and a metal film on the second impurity-doped semiconductor film.

35. A thin film transistor according to claim 30; wherein said high resistivity semiconductor film comprises an amorphous silicon film.

36. A thin film transistor according to claim 30; wherein one of the first and second main electrodes comprises a source electrode and the other of the first and second main electrodes comprises a drain electrode.

* * * * *